(12) United States Patent
Smallcombe (10) Patent No.: US 6,218,835 B1
(45) Date of Patent: Apr. 17, 2001

(54) ACCELERATING NMR SAMPLE THERMAL EQUILIBRATION BY RF HEATING

(75) Inventor: Stephen H. Smallcombe, Redwood City, CA (US)

(73) Assignee: Varian, Inc., Palo Alto, CA (US)

(*) Notice: Subject to any disclaimer, the term of this patent is extended or adjusted under 35 U.S.C. 154(b) by 0 days.

(21) Appl. No.: 09/365,190

(22) Filed: Aug. 2, 1999

(51) Int. Cl.[7] ............................................. G01V 3/00
(52) U.S. Cl. .................................... 324/315; 324/300
(58) Field of Search .................................. 324/315, 318, 324/321, 300, 307, 309

(56) References Cited

U.S. PATENT DOCUMENTS

| | | | |
|---|---|---|---|
| 4,365,199 | 12/1982 | McNair | 324/318 |
| 4,489,275 | 12/1984 | Sancier et al. | 324/315 |
| 5,192,910 | 3/1993 | Hepp et al. | 324/315 |
| 5,300,888 | 4/1994 | Webster et al. | 324/315 |
| 5,408,181 | 4/1995 | Dechene et al. | 324/307 |
| 5,530,353 | 6/1996 | Blanz | 324/315 |

OTHER PUBLICATIONS

Article by Webster et al., entitled "High Temperature $^1$H NMR Probe," published in *Rev.Sci.Instrum.* in Mar. 1979, 50(3), pp. 390–391.

Article by Maresch et al., entitled "High–temperature NMR Using Inductive Heating," published in *Rev.Sci.Instrum.* in Jan. 1990, 61(1), pp. 77–80.

Article by Alderman et al., entitled "An Efficient Decoupler Coil Design which Reduces Heating in Conductive Samples in Superconducting Spectrometers," published in *Journal of Magnetic Resonance* in 1979, in vol. 36, pp. 447–451.

Varian NMR software manual "VNMR User Programming" Version 6.1B, pp. 175–176 and 531, Pub. No. 01–999087–00 A1298, Varian Associates, Inc.

*Primary Examiner*—Louis Arana
(74) *Attorney, Agent, or Firm*—Bella Fishman Andrei Popovici (57) ABSTRACT

Radio-frequency (RF) heating is used to accelerate the thermal equilibration of dielectrically lossy nuclear magnetic resonance (NMR) samples. High-power heating RF pulses are applied to the sample before lower-power measurement RF pulses, using any of the NMR probe coils. The heating pulses are offset in frequency relative to the measurement pulses, such that the heating pulses do not magnetically affect the spins of interest. Heating pulse sequences of decreasing power can be used to prevent the sample temperature from overshooting the desired equilibrium temperature. Heating RF pulses can pre-establish the thermal effects of both measurement-independent and measurement-dependent heating. For pre-establishing the thermal effects of measurement-dependent heating, the heating pulse transients are chosen to be proportional to subsequent measurement pulse transients.

29 Claims, 9 Drawing Sheets

ACCELERATING NMR SAMPLE THERMAL EQUILIBRATION BY RF HEATING

FIELD OF THE INVENTION

This invention relates to systems and methods for performing nuclear magnetic resonance (NMR) measurements, and in particular to systems and methods for reducing thermal equilibration times for NMR samples.

BACKGROUND OF THE INVENTION

Many NMR applications involve performing measurements at elevated temperatures. Such measurements typically require heating the samples of interest from ambient temperature to an elevated temperature of interest. In a common design approach, the sample of interest is heated by flowing a hot gas over a sample container positioned in an NMR probe. For descriptions of NMR systems and probes using gas-flow heating see for example U.S. Pat. Nos. 5,530,353,5,408,181, and 5,192,910. The gas-flow heating method may require minutes of waiting between measurements in order to allow the samples to come to thermal equilibrium at the desired elevated temperature. The waiting periods often limit system throughput.

In U.S. Pat. No. 5,300,888, Webster et al. describe an NMR probe including a non-inductive heating winding encapsulated within the probe wall. The temperature of a sample within the probe is presumably controlled by resistively heating the winding. A probe including a heating winding is also described by Webster et al. in the article "High Temperature $^1$H NMR Probe," Rev. Sci. Instrum. 50(3):390–391 (1979).

In the article "High-Temperature NMR using Inductive Heating," Rev. Sci. Instrum. 61(1):77–80 (1990), Maresch et al. describe heating an NMR sample by applying RF energy to a metal-coated sample tube. The applied RF energy heats the metal coating of the sample tube, which in turn heats the sample.

SUMMARY OF THE INVENTION

The present invention provides NMR methods and devices for accelerating the thermal equilibration of NMR samples. A sample of interest is inserted into a nuclear magnetic resonance probe of an NMR spectrometer. The sample is held in a conventional electrically insulative sample holder. Typically but not necessarily, the probe is initially at a higher temperature than the sample. A set of heating radio-frequency pulses is applied to the sample, for accelerating the thermal equilibration of the sample at a desired measurement temperature. The sample is dielectrically lossy, and is heated directly through its interaction with the heating pulses. After the sample attains a suitable thermal equilibrium, a set of measurement pulses is applied to the sample, and the NMR response of the sample to the measurement pulses is measured.

In order to facilitate a rapid heating rate for the sample, the heating pulse frequencies, powers, durations, and interpulse spacings are chosen such that the heating pulses deposit into the sample more thermal energy per unit time than the measurement pulses. For heating pulses of the same frequency as the measurement pulses, the time-averaged power of the heating pulses is higher than the time-averaged power of the measurement pulses.

In the absence of heating pulses, the sample can generally be heated through two mechanisms: thermal contact with its environment, and direct interactions with applied measurement pulses. The first mechanism is typically measurement-independent, while the second mechanism is measurement-dependent. High-power RF heating pulses can be used to accelerate the thermal equilibration of the sample in the presence of either or both measurement-independent and measurement-dependent heating.

In one embodiment, the probe is heated by establishing thermal communication between the probe and a measurement-independent external heating device. For example, the sample holder within the probe can be heated by running a hot gas over its walls. High-power RF heating pulses can then be applied to accelerate the heating of the sample from the ambient temperature to a pre-measurement probe temperature. The pre-measurement probe temperature is the temperature of the probe prior to the application of the measurement pulses. The difference between the initial (ambient) sample temperature and the pre-measurement probe temperature can range up to hundreds of ° C.

High-power RF heating pulses can also be applied to accelerate the heating of the sample from the pre-measurement probe temperature to an equilibrium measurement temperature. The difference between the pre-measurement probe temperature and the equilibrium measurement temperature can range from negligible to a few ° C. A plurality of heating pulses or pulse subsequences of decreasing power can be used to minimize the time required for thermal equilibration, while preventing overshooting of the equilibrium temperature. Each pulse subsequence can be set to be proportional to the set of measurement pulses. Using heating subsequences that are proportional to the set of measurement pulses serves to automatically control or optimize the energy deposited into the sample by the heating pulses, for various measurement pulse sequences.

The heating pulse amplitudes, durations, and interpulse spacings are preferably chosen so as to minimize the time required for adequate thermal equilibration of the sample. The amplitudes, durations and interpulse spacings of the set of heating pulses are preferably predetermined, for example according to empirical calibration data taken for a given sample and desired temperature change. Alternatively, real-time NMR spectral data indicative of the sample temperature are used to dynamically control the heating pulses. The spectral data can be used to determine whether the sample has attained a suitable thermal equilibrium. Subsequent heating pulses are then controlled according to whether the sample has attained thermal equilibrium.

The heating and measurement pulses can be applied using one or more of the RF coils. The heating and measurement pulses are preferably offset in frequency, for mitigating the magnetic (non-thermal) effect of the heating pulses on the spins of interest in the sample.

The present invention further provides an NMR apparatus comprising a sample holder for holding an NMR sample, a set of coils inductively coupled to the sample holder, and control and measurement electronics electrically connected to the set of coils. The set of coils comprises one or more coils. The control electronics control the set of coils to apply to the sample the heating and measurement RF pulses. The measurement electronics measure the NMR response of the sample to the measurement pulses. The apparatus can further comprise a heating device in thermal communication with the sample holder, for heating the sample. The heating device preferably comprises a gas pump and heater in thermal communication with the sample through a hot gas flow.

In one embodiment, the control electronics are connected and responsive to the measurement electronics, for dynamically controlling the heating pulses according to NMR spectral data indicative of the sample temperature or of whether the sample has attained a suitable thermal equilibrium.

Further provided is an NMR apparatus comprising RF heating means for applying the heating RF pulses to the sample, RF measurement pulse application means for applying the measurement RF pulses, and measurement means for measuring the NMR response of the sample to the measurement pulses. The RF heating means and the measurement pulse application means include RF control electronics for applying the heating and measurement pulses. The measurement means include detection/acquisition electronics for acquiring time-domain waveforms of sample responses to applied measurement pulses.

BRIEF DESCRIPTION OF THE DRAWINGS

FIGS. 2-A through 2-E show heating and measurement radio-frequency (RF) pulse sequences for two NMR channels according to various embodiments of the present invention.

FIG. 3-A illustrates the chemical shift in Hz of a HOD signal as a D$_2$O/HOD sample initially at room temperature comes to thermal equilibrium in a heated (50° C.) probe in the absence of RF heating.

FIG. 3-B shows the data of FIG. 3-A as a contour plot.

FIG. 4-A shows the chemical shift of the sample of FIG. 3-A after the sample is preheated using RF frequency at 38 dB.

FIG. 4-B illustrates the chemical shift of the sample of FIG. 3-A after the sample is preheated using RF pulses at 39 dB.

FIG. 4-C shows the chemical shift of the sample of FIG. 3-A after the sample is preheated using RF pulses at 40 dB.

DETAILED DESCRIPTION OF THE INVENTION

In the following description, a set of pulses is understood to comprise at least one pulse (i.e. one or more pulses). Similarly, a set of coils is understood to comprise at least one coil. The statement that a first pulse has a lower power than a second pulse is understood to mean that the first pulse has a lower amplitude than the second pulse for at least part of the durations of the first and second pulses. Values of energy-per-unit-time or time-averaged power for the measurement pulses and heating pulses are understood to be averaged over the entire corresponding pulse sequences—from the first to the last heating pulse, and from the first to the last measurement pulse. The term "sample" is understood to encompass both compounds containing nuclei of interest and any solvent(s) containing such compounds. The term "dielectrically lossy" is understood to refer to materials that are substantially heated by RF energy; the term encompasses good conductors as well as compositions which conduct electrical current only to a limited extent. Determining whether a sample has attained a suitable thermal equilibrium is understood to encompass determining whether the sample temperature is within a predetermined threshold of a target temperature, and/or whether the rate of change of the sample temperature is lower than a predetermined threshold. The statement that heating pulses are "high-power" is understood to mean that the thermal energy per unit time deposited into the sample is higher for the heating pulses than for the subsequent measurement pulses. The term "probe temperature" is understood to refer to a temperature of a part of the probe holding the sample. The statement that the temporal structure of a first pulse sequence matches the temporal structure of a second pulse sequence is understood to mean that the pulse durations and interpulse spacings for the first and second pulse sequences are substantially identical. The statement that a first pulse sequence is proportional to a second pulse sequence is understood to mean that the two pulse sequences have matching temporal structures, and that the power ratios between the two sequences are equal for each pair of corresponding pulses.

The following description illustrates embodiments of the invention by way of example and not necessarily by way of limitation.

Figure 1:
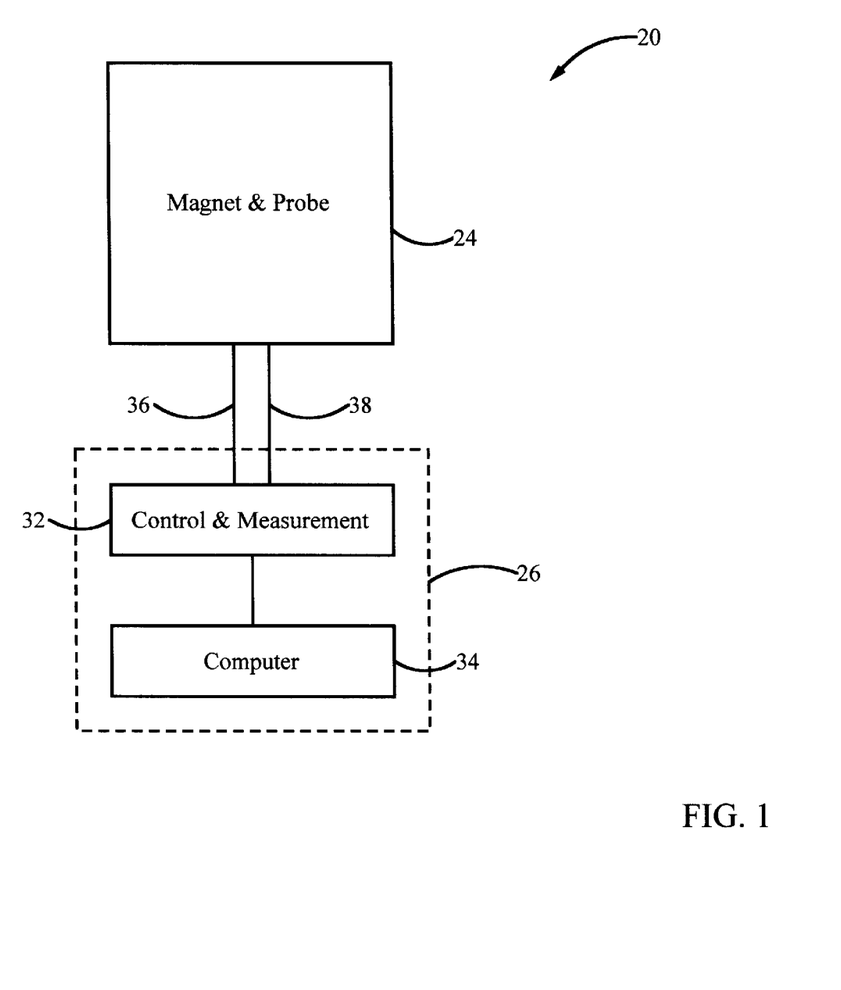
FIG. 1 shows a schematic view of a nuclear magnetic resonance (NMR) spectrometer according to the preferred embodiment of the present invention.

FIG. 1 shows a schematic view of a preferred nuclear magnetic resonance (NMR) spectrometer 20 of the present invention. Spectrometer 20 comprises a magnet/probe system 24 for holding a sample of interest, applying magnetic fields and RF energy to the sample, and detecting the response of the sample to the applied magnetic fields and RF energy. Magnet/probe system 24 is conventional, for example as used in the Varian Unity/Inova™ or Mercury™ NMR spectrometers.

Magnet/probe system 24 comprises a magnet and an NMR probe, including associated shim, gradient, and RF coils, and field lock, temperature control and temperature detection components, all conventional. The probe holds a dielectrically lossy sample of interest, for example an aqueous solution containing organic molecules. Other suitable sample solvents include organic compounds such as benzene, acetone, and chloroform, among others. The sample is contained in a sample holder made of an electrically insulative material, such that the sample holder is not heated by applied RF energy.

One or more radio-frequency (RF) coils are inductively coupled to the sample holder, for irradiating the sample with RF waves of frequencies of interest and for acquiring NMR data characterizing the sample of interest. Each RF coil is used to apply RF energy of a frequency of interest for a particular nucleus such as $^1$H, $^{19}$F, $^{31}$P, or $^3$C. The temperature detection components include a temperature detector such as a thermocouple, for dynamically measuring the sample temperature. The temperature control components preferably include a fluid conduit for running a heated dry gas such as air or nitrogen over the sample holder, to facilitate heating the sample to a desired temperature. The temperature control components are connected and responsive to the temperature detection components.

A control and acquisition system 26 is connected to probe/magnet system 24. System 26 comprises special-purpose control and acquisition components 32 connected to probe/magnet system 24 through an electrical connection 36 and a fluid connection 38. Control/acquisition components 32 comprise a temperature control device connected to the NMR probe through fluid connection 38. The temperature control device comprises a dry gas source (pump) and associated heater and fluidic connections. Control/acquisition components 32 further comprise control and acquisition electronics connected to the probe/magnet system 24 through electrical connection 36. A general purpose computer 34 is electrically connected to components 32, for controlling the operation of components 32. In particular, software implemented on computer 34 controls the amplitudes, lengths, and interpulse spacings of radio-frequency pulses applied to the sample.

Before insertion into the probe, the sample is stored at an ambient temperature—e.g. room temperature, 25° C. If an NMR measurement is to accurately characterize the sample at a higher measurement temperature, e.g. 50° C., the sample must come to an adequate thermal equilibrium at the measurement temperature before the measurement is performed. For an aqueous solution initially at 25° C. inserted in a sample holder heated by 50° C. gas flowing over the sample holder, adequate thermal equilibration solely through thermal contact with the holder walls may take on the order of a few minutes, as illustrated in the Example below.

The thermal equilibration process is accelerated by applying a set of heating RF pulses to the sample. The heating RF pulses induce eddy currents within the sample, exciting chemical bonds and heating the sample throughout its volume. The sample is heated directly through its interaction with the applied RF heating pulses. The direct interaction of the sample with the applied heating pulses ensures that the sample is heated from the inside, rapidly and uniformly relative to indirect heating methods in which the sample is heated by thermal contact to an outside component such as the sample holder.

The heating of NMR samples by applied RF energy has been characterized in the prior art as a nuisance. In an article in *J. Magnetic Resonance* 36:447–451 (1979), Alderman et al. state that "the heating of conductive samples [. . . ] by high-power wide-band proton decoupling is a vexing problem." Alderman et al. propose a decoupler coil design that minimizes electric fields in the sample, thus allowing a reduction in sample RF heating.

The present invention relies on the observation that, rather than a-nuisance, RF heating can be a useful tool for the NMR scientist. In the present invention, the heating RF pulses are preferably applied using one or more of the conventional RF coils of spectrometer 20. No special-purpose coils, sample holder, or probe design are required. The RF heating method can be implemented conveniently with conventional hardware, by modifying the software controlling the amplitudes and durations of the RF pulses applied to the sample.

The heating pulse characteristics (durations, amplitudes and interpulse spacings) are preferably chosen so as to minimize the time required to bring the sample to an adequate thermal equilibrium without overshooting the desired equilibrium temperature. In particular, the heating pulse characteristics are chosen such that the set of heating pulses deposits into the sample more thermal energy per unit time than the set of measurement pulses. For closely-spaced or identical heating and measurement frequencies, the energy condition above can be restated as requiring that the time-averaged pulse power for the set of heating pulses is higher than the time-averaged pulse power for the set of measurement pulses. The time-averaging is understood to be performed over the entire heating and measurement time periods, respectively.

If the heating amplitudes and/or durations are too low, the time required to attain the equilibrium temperature is higher than optimal. If the heating amplitudes and/or durations are too high, the temperature of the sample may overshoot the desired equilibrium temperature before the sample comes to thermal equilibrium with its surroundings. Presumably, overshooting can be attributed at least in part to incidental heating of probe structures by the heating pulses. The sample temperature can continue to increase after the heating pulses are stopped, as the sample receives energy through thermal communication with distal probe structures.

Optimal amplitudes and durations for the heating pulses so as to prevent undershoot or overshoot can be determined emipirically by the skilled artisan for a given sample, probe, and desired equilibrium temperature. Suitable heating pulse durations may range from $10^{-4}$ to $10^2$ seconds, while suitable heating pulse powers may range from $10^{-3}$ to $10^3$ W. For heating samples over large temperature spans (>10° C.), the time-averaged heating pulse power preferably exceeds the time-averaged measurement pulse power by a value on the order of W to tens of W (e.g. 1–10 W). For heating sample over short temperature spans (tenths of ° C. to a few ° C.), such as temperature spans determined by measurement-dependent heating, the time-averaged heating pulse power is preferably chosen to be a factor of 2 to 4 higher than the time-averaged measurement pulse power.

Preferably, the frequency or frequencies of the applied heating pulses is/are sufficiently offset from the NMR frequencies of interest that the applied heating pulses do not substantially affect the nuclei of interest. The frequency offset between the heating and measurement frequencies is preferably at least a few hundred kHz. The two frequencies can also be offset in order to speed up the sample heating. The heating frequency is then chosen to correspond to a higher energy absorption coefficient than the measurement frequency. In such a case, the energy per unit time absorbed by the sample from the heating pulses can be higher than the energy per unit time absorbed from the measurement pulses, even if the time-averaged power of the applied measurement pulses is higher than that of the heating pulses.

Measurements are performed on the sample after the sample attains a suitable thermal equilibrium. Reaching adequate thermal equilibration preferably entails ensuring that the sample temperature is within a predetermined range (e.g. 0.1–1° C.) of the desired equilibrium temperature, and/or that the rate of change of the sample temperature does not exceed a predetermined threshold (e.g. 0.1–1° C./min). A set of RF measurement pulses is applied to the sample in order to excite the nuclei of interest. Measurement pulses can include excitation pulses for exciting the nuclei of interest, and decoupling pulses for decoupling undesired spins from the nuclei of interest from undesired spins. The response of the nuclei of interest is then measured in a conventional manner, by acquiring free induction decays using the probe RF coils.

The heating pulse characteristics are preferably predetermined for a given sample and desired sample temperature. The characteristics can also be dynamically controlled according to temperature data characterizing the sample. The temperature data can include the temperature of the sample and/or the rate of change of the temperature of the sample.

Suitable temperature data can be determined from NMR spectral measurements performed on the sample. The spectral measurements can be run periodically, at predetermined intervals between heating pulse sequences. During the spectral measurements used for temperature determination, spectrometer 20 can be run either locked or unlocked. Locking entails dynamically adjusting the applied magnetic field $B_0$ so as to maintain a reference resonance frequency at a given value.

Figure 2:
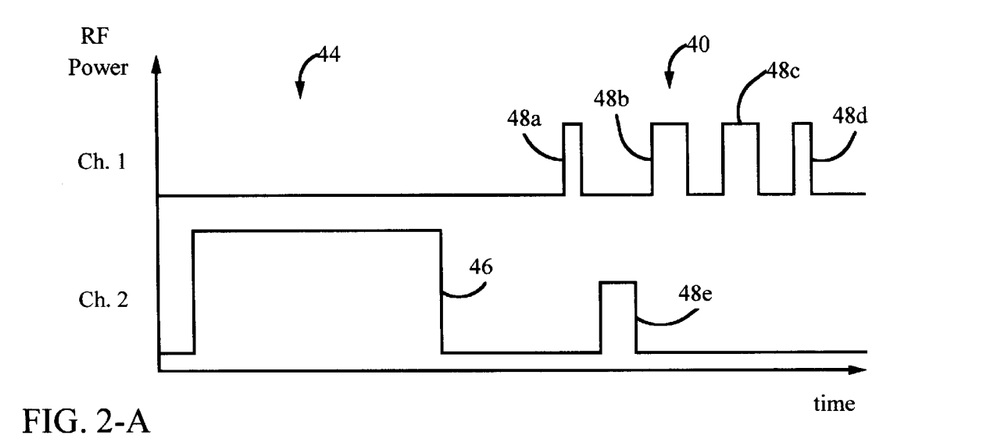

FIG. 2-A illustrates a measurement RF pulse sequence 40 preceded by a heating RF pulse sequence 44. The pulse amplitudes shown are not necessarily to scale. Pulse sequences 40 and 44 are applied on two RF-channels—e.g.

on $^1$H and $^{13}$C channels. Heating pulse sequence 44 consists of a single long pulse 46 applied on channel 2. The duration of pulse 46 is on the order of seconds. Measurement pulse sequence 40 comprises plural pulses 48a–d applied on channel 1 and a pulse 48e applied on channel 2. Measurement sequence 40 is followed by plural (16–64) identical sequences (not shown). As is clear to the skilled artisan, various other measurement sequences are suitable for use in the present invention.

Heating sequence 44 deposits into the sample more energy per unit time than measurement sequence 40. The power of heating pulse 46 is higher than the power of at least one of pulses 48a–e. In particular, the power of heating pulse 46 is higher than the time-averaged power of pulses 48a–e, and than the power of each of measurement pulses 48a–e. Using a high power for heating pulse 46 allows shortening the time required to bring the sample to thermal equilibrium at a desired elevated temperature.

FIG. 2-B shows an alternative heating pulse sequence 144 followed by a measurement pulse sequence 140. Pulse sequence 144 comprises a plurality of heating pulses 144a–d separated by interpulse spacings 150a–c.

Consider now a sample at thermal equilibrium with its surroundings in the absence of applied RF pulses. Such a sample may be for example a room-temperature sample inserted in an unheated sample holder initially at room temperature. Such a sample may also be in thermal equilibrium at an elevated temperature in a gas-heated sample holder, prior to the application of any RF pulses. As measurements are performed on the sample, the measurement RF pulses cause a measurement-dependent heating of the sample. For a sample in aqueous solution and typical average power levels on the order of tenths of W to several W, measurement-dependent heating can cause a rise of a few tenths of ° C. to a few ° C. in the sample temperature as measurement pulses are applied to the sample. The sample comes to thermal equilibrium when the RF heating due to the applied measurement pulses is compensated by the cooling of the sample through heat loss to its surroundings. Thermal equilibration may take a few (5–10) minutes for an aqueous sample of ~0.5 ml volume subjected to dummy transients scans of measurement-level power. For information on applying dummy scans of measurement-level power see for example the Varian NMR software manual "VNMR User Programming" Version 6.1B, p. 175–176 and 531, Pub No. 01-999087-00 A1298, Varian Associates, Inc.

High-power heating RF pulses can be used to accelerate the thermal equilibration of the sample to a measurement temperature determined at least in part by measurement-dependent heating. For an aqueous sample of ~0.5 ml volume, applying high-power heating pulses can reduce the measurement-dependent temperature equilibration times to periods of a few seconds to tens of seconds.

FIG. 2-C illustrates a heating pulse sequence 244 followed by a measurement pulse sequence 240, suitable for simulating (pre-establishing) the thermal effects of measurement-dependent heating. Heating sequence 244 comprises plural subsequences (transients) 252a–b of decreasing power. Only two subsequences are illustrated for simplicity. Each pulse of subsequences 252a–b has a constant power over its duration, and the pulses of subsequence 252b have a lower power than the pulses of subsequence 252a. At the same time, not all pulses within each subsequence 252a–b have equal power. The time-averaged power of the heating pulses of subsequence 252b is substantially equal to the time-averaged power of the measurement pulses of sequence 240. Subsequence 252a may be followed by plural (e.g. 4–8) other transients (not shown) of identical or decreasing power. Similarly, subsequence 252b may be followed by plural (e.g. 64–128) transients of identical power.

Each subsequence 252a–b is proportional to measurement sequence 240. The temporal structure of subsequence 252a matches the temporal structure of measurement sequence 240. Similarly, the temporal structure of subsequence 252b matches the temporal structure of sequence 240. The duration of the nth pulse 252a is equal to the duration of the nth pulse 252b, and the interpulse spacing between the nth and (n+1)th pulses 252a is equal to the interpulse spacing between the nth and (n+1)th pulses 252b, for all values of n. The ratio of the powers of the nth heating and measurement pulses is equal to the ratio of the powers of the (n+1)th heating and measurement pulses. At the same time, the power ratio may decrease over time between different subsequences. For example, the power ratio may start at 4 (12 dB) for the first heating subsequence, then decrease by 3 dB for each heating subsequence thereafter until the measurement power is reached.

Employing heating pulse subsequences proportional to subsequent measurement pulse sequences alleviates the need to determine optimal heating pulse characteristics for multiple measurement pulse sequences and samples. The operator need only determine suitable power ratios and their time dependences. The same predetermined heating-to-measurement power ratio may then be used for different samples and measurement pulse sequences. The pre-measurement heating automatically reflects the heating caused by the measurement pulses.

FIG. 2-D shows an alternative heating pulse sequence 344 followed by a measurement pulse sequence 340, also suitable for pre-establishing the thermal effects of measurement-dependent heating. Heating sequence 344 comprises a plurality of heating pulses of decreasing power. The power of each subsequent pulse in sequence 344 is lower than that of its preceding pulse. The power of the last pulses approaches the power of the pulses of measurement sequence 340.

FIG. 2-E illustrates another alternative heating pulse sequence 444 followed by a measurement pulse sequence 440. Heating sequence 444 comprises a heating pulse 446a followed by a plurality of heating pulse subsequences 452a–b of decreasing power. Heating pulse 446a accelerates the sample heating to a high-temperature determined by measurement-independent heating of the sample. The power level of pulse 446a is not uniform: the power level decreases over time, approaching the power level of the pulses of sequence 440. Subsequently, subsequences 452a–b accelerate the sample heating by simulating the thermal effects of the measurement-dependent heating induced by pulse sequence 440. Subsequences 452a–b heat the sample from the high-temperature determined by measurement-independent heating to a slightly higher temperature determined by measurement-dependent heating.

The following Example is intended to illustrate particular aspects of the invention, and should not be construed to limit the invention.

EXAMPLE

A method of the present invention was evaluated for HOD/DOD samples initially at room temperature (25° C.). The samples were injected into a 120 µl flow probe pre-equilibrated at 50° C. NMR spectra were then taken using a Varian Mercury™ spectrometer. All spectral measurements were run unlocked. Each spectrum contained data from 128 single transient acquisitions taken every 3 seconds.

Figure 3:
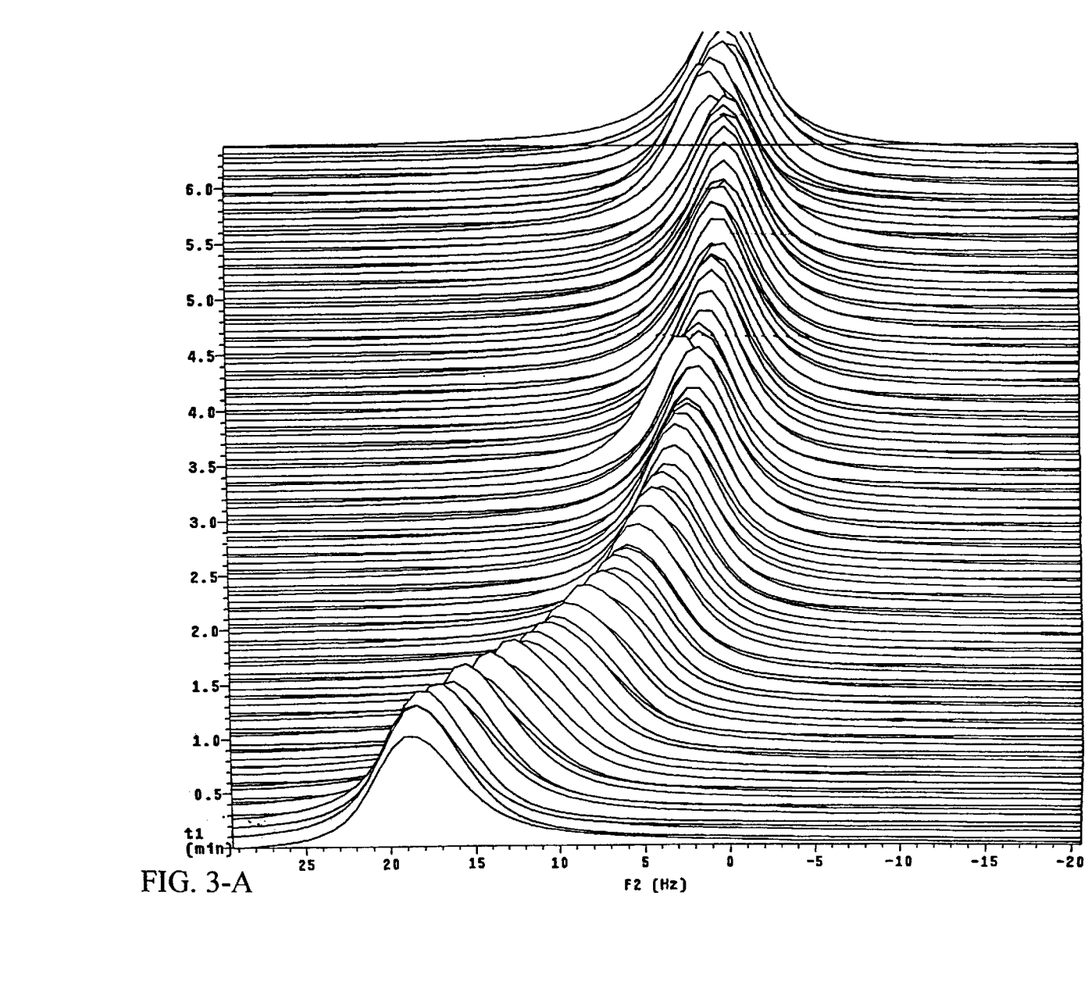

FIG. 3-A shows the chemical shift in Hz of the HOD signal as a sample comes to thermal equilibrium in the absence of RF heating. FIG. 3-B shows the data of FIG. 3-A as a contour plot, with the x-axis (frequency) converted to temperature (° C.). As can be seen from FIGS. 3-A and 3-B, the sample approaches thermal equilibrium over a few minutes. While substantial equilibrium is achieved after 3–4 minutes, the sample temperature continues to change even after 6 minutes.

Figure 4:
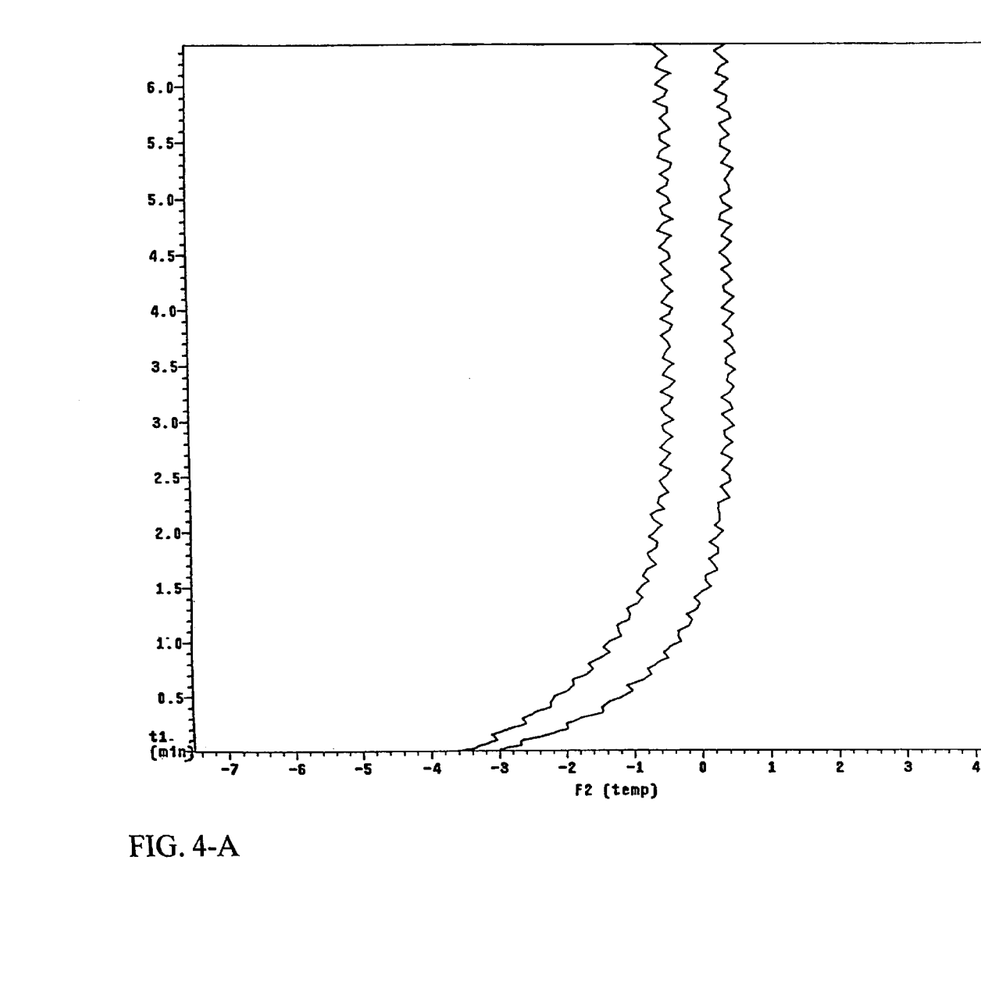

FIG. 4-A shows spectral data for the sample of FIG. 3-A, taken after RF heating of the sample. Immediately after sample injection, an 8-transient high-power pre-experiment was run to provide sample heating, followed immediately by the experiments for which data is shown. The sample was heated by turning the $^{13}$C decoupler coil on for 2 seconds and off for 1 second for each of the 8 pre-experiment transients. The decoupler power level was 38 dB relative to an arbitrary power level. As FIG. 4-A illustrates, the RF heating during the pre-experiment accelerated the thermal equilibration of the sample. The thermal equilibration was substantially complete 2 minutes after the pre-experiment.

FIGS. 4-B and 4-C show data for experiments similar to that FIG. 4-A, for decoupler power levels of 39 dB and 40 dB, respectively. For the data of FIG. 4-B, the sample temperature gets to within a few tenths of ° C. of the desired equilibrium temperature in less than a minute and a half. In both FIGS. 4-B and FIG. 4-C, the sample temperature overshoots the desired equilibrium temperature. Nevertheless, the sample achieves quasi-equilibration faster than in the absence of RF heating.

It will be clear to one skilled in the art that the above embodiments may be altered in many ways without departing from the scope of the invention. For example, RF pulses need not have time-invariant amplitudes. The probe need not be heated. Suitable temperatures for the probe and sample holder walls can range from −100° C. to 200° C. Heating and/or measurement pulses can be applied on more than two (e.g. four or more) frequency channels. Both pulse power and thermal energy absorbed by the sample per unit time can be employed as figures of merit characterizing the applied measurement and heating pulses. Absorbed energy can be a particularly relevant parameter if the measurement and heating frequencies are different. Accordingly, the scope of the invention should be determined by the following claims and their legal equivalents.

What is claimed is:

1. A nuclear magnetic resonance measurement method comprising the steps of:
   a) inserting a sample into a nuclear magnetic resonance probe;
   b) accelerating a thermal equilibration of said sample by applying a set of heating radio-frequency pulses to said sample, wherein an interaction of said heating pulses with said sample causes a heating of said sample;
   c) subsequently to applying said set of heating pulses, applying a set of measurement radio-frequency pulses to said sample, wherein said set of heating pulses deposits into said sample more thermal energy per unit time than said set of measurement pulses; and
   d) measuring a nuclear magnetic resonance response of said sample to said set of measurement pulses.

2. The method of claim 1, further comprising the step of heating said probe by establishing thermal communication between said probe and a heating device.

3. The method of claim 1, wherein said set of heating pulses comprises a pulse subsequence for heating said sample from a pre-measurement probe temperature to an equilibrium measurement temperature.

4. The method of claim 1, wherein said set of heating pulses comprises a plurality of heating pulses.

5. The method of claim 1, wherein said set of heating pulses comprises a plurality of heating pulse subsequences of decreasing power, each said heating subsequence being proportional to said set of measurement pulses.

6. The method of claim 1, wherein said set of heating pulses comprises a plurality of heating pulses of decreasing power.

7. The method of claim 1, further comprising the step of dynamically controlling said set of heating pulses according to nuclear magnetic resonance spectral data indicative of a temperature of said sample.

8. The method of claim 1, further comprising the step of:
   a) determining from nuclear magnetic resonance spectral data whether said sample has attained a suitable thermal equilibrium; and
   b) controlling said set of heating pulses according to whether said sample has attained said equilibrium.

9. The method of claim 1, comprising the step of offsetting in frequency at least one heating pulse relative to said set of measurement pulses.

10. The method of claim 1, wherein said set of heating pulses and said set of measurement pulses are applied using a single radio-frequency coil.

11. The method of claim 1, wherein a difference between a time-averaged power of said set of heating pulses and a time-averaged power of said set of measurement pulses exceeds 1 W.

12. The method of claim 11, wherein said difference is less than 10 W.

13. An apparatus for performing nuclear magnetic resonance measurements, comprising:
   a) a sample holder for holding a nuclear magnetic resonance sample;
   b) a set of coils inductively coupled to said sample holder;
   c) a polarizing magnet in combination with an RF source for exciting magnet resonance in said sample;
   d) control electronics electrically connected to said set of coils, for controlling said set of coils to apply to said sample
      a set of heating radio-frequency pulses for accelerating a thermal equilibration of said sample, wherein an interaction of said heating pulses with said sample causes a heating of said sample, and subsequently
      a set of measurement radio-frequency pulses for performing a nuclear magnetic resonance measurement on said sample,
      wherein said set of heating pulses deposits into said sample more thermal energy per unit time than said set of measurement pulses; and
   e) measurement electronics electrically connected to said set of coils, for measuring a nuclear magnetic resonance response of said sample to said set of measurement pulses.

14. The apparatus of claim 13, further comprising a heating device in thermal communication with said sample holder, for heating said sample.

15. The apparatus of claim 13, wherein said set of heating pulses comprise a pulse subsequence for heating said sample from a pre-measurement probe temperature to an equilibrium measurement temperature.

16. The apparatus of claim 13, wherein said set of heating pulses comprises a plurality of heating pulses.

17. The apparatus of claim 13, wherein said set of heating pulses comprises a plurality of heating subsequences of decreasing power, each said heating subsequence being proportional to said set of measurement pulses.

18. The apparatus of claim 13, wherein said set of heating pulses comprises a plurality of heating pulses of decreasing power.

19. The apparatus of claim 13, wherein said control electronics are connected and responsive to said measurement electronics, for dynamically controlling said set of heating pulses according to nuclear magnetic resonance spectral data indicative of a temperature of said sample.

20. The apparatus of claim 13, wherein said control electronics are responsive to said measurement electronics, for dynamically controlling said set of heating pulses according to nuclear magnetic resonance spectral data indicative of whether said sample has attained a suitable thermal equilibrium.

21. The apparatus of claim 13, wherein at least one heating pulse is offset in frequency relative to said set of measurement pulses, whereby a magnetic effect of said at least one heating pulse on said sample is mitigated.

22. The apparatus of claim 13, wherein said set of heating pulses and said set of measurement pulses are applied using a single radio-frequency coil.

23. The apparatus of claim 13, wherein a difference between said time-averaged power of said set of heating pulses and said time-averaged power of said set of measurement pulses exceeds 1 W.

24. The apparatus of claim 23, wherein said difference is less than 10 W.

25. An apparatus for performing nuclear magnetic resonance measurements, comprising:
   a) radio-frequency heating means for applying a set of heating radio-frequency pulses to a nuclear magnetic resonance sample, for accelerating a thermal equilibration of said sample through an interaction of said heating pulses with said sample;
   b) radio-frequency measurement pulse application means for applying a set of measurement radio-frequency pulses to said sample subsequently to an application of said set of heating pulses, for performing a nuclear magnetic resonance measurement on said sample, wherein said set of heating pulses deposits into said sample more thermal energy per unit time than said set of measurement pulses; and
   c) measurement means for measuring a nuclear magnetic resonance response of said sample to said set of measurement pulses.

26. A nuclear magnetic resonance measurement method comprising the steps of:
   a) inserting a liquid sample having an initial temperature into a heated nuclear magnetic resonance probe having a probe temperature higher than said initial temperature;
   b) accelerating a thermal equilibration of said sample by applying a set of heating radio-frequency pulses to said sample, wherein an interaction of said heating pulses with said sample causes a heating of said sample;
   c) subsequently to said equilibration, applying a set of measurement radio-frequency pulses to said sample for performing a nuclear magnetic resonance measurement on said sample, wherein said set of heating pulses deposits into said sample more thermal energy per unit time than said set of measurement pulses; and
   d) measuring a nuclear magnetic resonance response of said sample to said set of measurement pulses.

27. A nuclear magnetic resonance measurement method comprising the steps of:
   a) inserting a liquid sample into a nuclear magnetic resonance probe, wherein said probe has a pre-measurement probe temperature prior to said inserting said sample into said probe;
   b) accelerating a thermal equilibration of said sample from said pre-measurement probe temperature to an equilibrium measurement temperature by applying a set of heating radio-frequency pulses to said sample, wherein said measurement temperature is determined by an equilibrium between a heating of said sample by a set of radio-frequency measurement pulses and a cooling of said sample through thermal communication with an environment of said sample;
   c) subsequently to said equilibration, applying said set of measurement pulses to said sample for performing a nuclear magnetic resonance measurement on said sample, wherein said set of heating pulses deposits into said sample more thermal energy per unit time than said set of measurement pulses; and
   d) measuring a nuclear magnetic resonance response of said sample to said set of measurement pulses.

28. A nuclear magnetic resonance measurement method comprising the steps of:
   a) inserting a sample into a nuclear magnetic resonance probe;
   b) causing approach to a thermal equilibration of said sample at a selected temperature by applying a set of heating radio-frequency pulses to said sample, wherein an interaction of said heating pulses with said sample causes a heating of said sample;
   c) subsequently to applying said set of heating pulses, applying a set of measurement radio-frequency pulses to said sample, wherein said set of heating pulses deposits into said sample more thermal energy per unit time than said set of measurement pulses; and
   d) measuring a nuclear magnetic resonance response of said sample to said set of measurement pulses;
   e) repeating steps b through d, inclusive, and comparing respective measured nuclear magnetic resonance responses to ascertain whether a state of thermal equilibrium prevails.

29. An apparatus for performing nuclear magnetic resonance measurements, comprising:
   a) a sample holder for holding a nuclear magnetic resonance sample;
   b) a set of coils inductively coupled to said sample holder;
   c) a polarizing magnet in combination with an RF source for exciting magnet resonance in said sample;
   d) control electronics electrically connected to said set of coils, for controlling said set of coils to apply to said sample
      a set of heating radio-frequency pulses for accelerating a thermal equilibration of said sample, wherein an interaction of said heating pulses with said sample causes a heating of said sample, and subsequently
      a set of measurement radio-frequency pulses for performing a nuclear magnetic resonance measurement on said sample, wherein said set of heating pulses deposits into said sample more thermal energy per unit time than said set of measurement pulses; and e) measurement electronics electrically connected to said set of coils, for measuring a nuclear magnetic resonance response of said sample to each said set of measurement pulses;

f) said central electronics comprising repetition control to perform repetition of said sets of heating and measuring pulses to obtain corresponding nuclear magnetic resonance responses and a memory to retain for comparison among a plurality of nuclear magnetic resonance responses acquired in a series of applications of said heating and measurement radio frequency pulses, whereby proximity to a state of thermal equilibrium is determinable.

* * * * *